(12) United States Patent
Oh et al.

(10) Patent No.: US 6,900,503 B2
(45) Date of Patent: May 31, 2005

(54) SRAM FORMED ON SOI SUBSTRATE

(75) Inventors: Chang-bong Oh, Seongnam (KR); Young-wug Kim, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 10/649,222

(22) Filed: Aug. 26, 2003

(65) Prior Publication Data

US 2004/0051143 A1 Mar. 18, 2004

(30) Foreign Application Priority Data

Sep. 4, 2002 (KR) .............................. 10-2002-0053329

(51) Int. Cl.$^7$ .......................................... H01L 29/786
(52) U.S. Cl. ..................... 257/350; 257/627; 257/903; 257/69; 365/176; 365/188
(58) Field of Search .............................. 257/903, 350, 257/627, 69; 365/176, 188

(56) References Cited

U.S. PATENT DOCUMENTS 5,384,473 A * 1/1995 Yoshikawa et al. ......... 257/255
5,886,388 A * 3/1999 Wada et al. ................. 257/393

\* cited by examiner

Primary Examiner—Jerome Jackson
(74) Attorney, Agent, or Firm—Mills & Onello LLP

(57) ABSTRACT

An SRAM capable of reducing the overall area consumed by the circuit and capable of improving the mobility and operational characteristics of a PMOS transistor is provided. The SRAM is formed on an SOI substrate having first and second active areas. A first access NMOS transistor and a first inverter, which is constituted by a first drive NMOS transistor and a first load PMOS transistor, are formed on the first active area of the SOI substrate. A second access NMOS transistor and a second inverter, which is constituted by a first drive NMOS transistor and a first load PMOS transistor, are formed on the second active area of the SOI substrate. Here, the channels of the first and second load PMOS transistors extend so that carriers move in a [110] silicon crystallization growth direction. In each active area, the drain (or source) of an access NMOS transistor, the drain of a drive NMOS transistor, and the drain of a load PMOS transistor contact one another in a shared region. Because the SRAM is formed on the SOI substrate, the size of the resulting chip can be reduced. Also, because the channels of the first and second load PMOS transistors extend so that carriers move in the [110] silicon crystallization growth direction, the mobility of the PMOS transistors is improved.

25 Claims, 5 Drawing Sheets

SRAM FORMED ON SOI SUBSTRATE

BACKGROUND OF THE INVENTION

This application claims priority from Korean Patent Application No. 2002-53329, filed on Sep. 4, 2002, in the Korean Intellectual Property Office, the disclosure of which is incorporated herein in its entirety by reference.

1. Field of the Invention

The present invention relates to a static random access memory (SRAM), and more particularly, to a full CMOS SRAM device having 6 transistors formed on a silicon-on-insulator (SOI) substrate.

2. Description of the Related Art

Semiconductor memory devices are classified into dynamic random access memories (DRAMs), non-volatile memories, and SRAMs according to the manner in which data is stored. SRAMs offer the advantage of fast operating speeds in a simple manner with low power consumption. Also, in contrast with DRAMs, since SRAMs do not need to refresh periodically-stored information, design and manufacture are relatively easy.

In general, SRAM cells are comprised of two drive transistors, two load devices, and two access transistors. SRAMs can in turn be classified into full CMOS SRAMs, high load resistor (HLR) SRAMs, and thin film transistor (TFT) SRAMs according to the type of load devices included. Full CMOS SRAMs use PMOS transistors as load devices, HLR SRAMs use HLRs as load devices, and TFT SRAMs use polysilicon TFTs as load devices.

A conventional full CMOS SRAM circuit is shown in FIG. 1. As shown in FIG. 1, a full CMOS SRAM includes first and second inverters INV1 and INV2, which form a latch, and access transistors TA1 and TA2 for selectively driving the first and second inverters INV1 and INV2.

The first inverter INV1 includes a first PMOS transistor TP1 and a first NMOS transistor TN1, and the second inverter INV2 includes a second PMOS transistor TP2 and a second NMOS transistor TN2. The source of each of the first and second PMOS transistors TP1 and TP2 is coupled to a voltage terminal Vdd. The drain of the first PMOS transistor TP1 is coupled to that of the first NMOS transistor TN1, while the drain of the second PMOS transistor TP2 is coupled to that of the second NMOS transistor TN2. The source of each of the first and second NMOS transistors TN1 and TN2 is coupled to a ground voltage terminal Vss. The gate of the first PMOS transistor TP1 is coupled to that of the first NMOS transistor TN1, and the two gates are coupled to the output terminal S2 of the second inverter INV2, that is, to a common drain between the second PMOS transistor TP2 and the second NMOS transistor TN2. The gate of the second PMOS transistor TP2 is coupled to that of the second NMOS transistor TN2, and the two gates are coupled to the output terminal S1 of the first inverter INV1, that is, to a common drain between the first PMOS transistor TP1 and the first NMOS transistor TN1.

The gate of the first access transistor TA1 is coupled to a word line WL, its source is coupled to a bit line BL, and its drain is coupled to the output terminal S1 of the first inverter INV1. Similarly, the gate of the second access transistor TA2 is coupled to the word line WL, its source is coupled to a bit line bar DBL, and its drain is coupled to the output terminal S2 of the second inverter INV2. Here, the bit line bar DBL line carries the inverted BL signal.

In the operation of the above-described full CMOS SRAM device, if the potential of the word line WL is high, the first and second access transistors TA1 and TA2 are turned on, and accordingly, the signals of the bit line BL and bit line bar DBL are transmitted to the first and second inverters INV1 and INV2, respectively. Accordingly, data writing or reading is performed.

A conventional CMOS SRAM having such a structure is integrated into a bulk silicon substrate having the layout shown in FIG. 2. FIG. 2 shows only an active area of an SRAM, a gate electrode (word line), and a contacting portion.

As shown in FIG. 2, an isolation film 15 is formed on a silicon semiconductor substrate 10 so as to define a NMOS transistor active area 30 and a PMOS transistor active area 50. The NMOS transistor active area 30 may have a P well, and is formed in, for example, a "U" shape. Hereinafter, both sidewalls of the "U" shape are referred to as vertical portions, and a portion connecting the vertical portions is referred to as a horizontal portion. The PMOS transistor active area 50 may have an N-well, and is formed in, for example, a bar shape.

The word line WL extends so as to cross a predetermined portion of the NMOS transistor active area 30, for example, both vertical portions of the NMOS transistor active area 30, at a right angle. First and second gate electrodes 60 and 65 are disposed so as to pass between the horizontal portion of the NMOS transistor active area 30 and a predetermined portion of the PMOS transistor active area 50. Here, the first and second gate electrodes 60 and 65 may be perpendicular to the word line WL. The first gate electrode 60 serves as the gate electrodes of the first NMOS transistor TN1 and the first PMOS transistor TP1, and the second gate electrode 65 serves as the gate electrodes of the second NMOS transistor TN2 and the second PMOS transistor TP2.

N-type impurities are implanted into the word line WL and a portion of the NMOS transistor active area 30 on the outer sides of the gate electrodes 60 and 65, so that the first and second access transistors TA1 and TA2 and the first and second NMOS transistors TN1 and TN2 are formed. P-type impurities are implanted into a portion of the PMOS transistor active area 50 on the outer sides of the gate electrodes 60 and 65 so that the first and second PMOS transistors TP1 and TP2 are formed.

In FIG. 2, reference character BLC denotes a contact area where the source of the first access transistor TA1 contacts a bit line BL, and reference character DBLC denotes a contact area where the source of the second access transistor TA2 contacts a bit line bar DBL. Reference characters S1, S1', S2, and S2' denote the output portions of the inverters INV1 and INV2. Although S1 and S1' are isolated from each other and S2 and S2' are isolated from each other, S1 and S2 will be coupled to S1' and S2', respectively, during wiring. Reference character Vdd denotes an area for contact with a Vdd line (not shown), reference character Vss denotes an area for contact with a Vss line (not shown), and reference character GC denotes an area where a gate electrode is to contact a gate power line (not shown) later.

However, when the conventional full CMOS SRAM is formed on a bulk silicon substrate, the following problems are generated. As shown in FIG. 2, since the conventional full CMOS SRAM includes a PMOS transistor and an NMOS transistor at the same time, a P-well active area for the NMOS transistor and an N-well active area for the PMOS transistor are needed. However, as well known, when an N well and a P well are disposed adjacent to each other, a parasitic bipolar transistor that creates a phenomenon referred to as "latch-up" may be formed. Hence, the P well must be isolated from the N well by a predetermined distance (A), that is, a distance great enough to prevent a latch-up from being formed. This distance (A) between the P well and the N well contributes to an increase in the chip size of an SRAM.

Also, since a PMOS transistor has a much slower mobility than the mobility of an NMOS transistor, the PMOS transistor must be larger than the NMOS transistor in order to provide for stable operation. Therefore, conventional full CMOS SRAMs having PMOS transistors are larger than SRAMs having no PMOS transistors.

SUMMARY OF THE INVENTION

The present invention provides an SRAM device that includes a unit cell that consumes a relatively smaller amount of chip area, such that an overall reduction in chip size can be realized.

The present invention also provides an SRAM device capable of improving the mobility of a PMOS transistor.

An SRAM according to an embodiment of the present invention includes first and second access NMOS transistors, first and second drive NMOS transistors, and first and second load PMOS transistors. The first drive NMOS transistor and the first load PMOS transistor constitute a first inverter which is selectively activated in response to the operation of the second access NMOS transistor. The second drive NMOS transistor and the second load PMOS transistor constitute a second inverter which is selectively activated in response to the operation of the first access NMOS transistor. The transistors are formed on active areas of an SOI substrate, and a portion of an active area where a load PMOS transistor is formed extends so as to make a predetermined angle with a portion of an active area where a NMOS transistor is formed.

An SRAM according to another embodiment of the present invention includes a semiconductor substrate and first and second active areas. The first active area is formed on the semiconductor substrate and has a first access NMOS transistor and a first inverter which is comprised of a first drive NMOS transistor and a first load PMOS transistor. The second active area is formed on the semiconductor substrate and has a second access NMOS transistor and a second inverter which is comprised of a second drive NMOS transistor and a second load PMOS transistor. A portion of each of the first and second active areas where the first and second load PMOS transistors are formed, respectively, extends so as to make a predetermined angle with a portion of each of the first and second active areas where the NMOS transistors are formed.

An SRAM according to still another embodiment of the present invention is formed with first and second access NMOS transistors, a first drive NMOS transistor and a first load PMOS transistor which constitute a first inverter that is selectively activated in response to the operation of the second access NMOS transistor, and a second drive NMOS transistor and a second load PMOS transistor which constitute a second inverter that is selectively activated in response to the operation of the first access NMOS transistor. The SRAM includes an SOI substrate and first and second active areas. The first active area is formed on the SOI substrate and has a first access NMOS transistor and a first inverter which is comprised of a first drive NMOS transistor and a first load PMOS transistor. The second active area is formed on the SOI substrate and has a second access NMOS transistor and a second inverter which is comprised of a second drive NMOS transistor and a second load PMOS transistor. A portion of each of the first and second active areas where the first and second load PMOS transistors are formed, respectively, extends so as to make a predetermined angle with a portion of each of the first and second active areas where the NMOS transistors are formed.

An SRAM according to yet another embodiment of the present invention is formed with first and second access NMOS transistors, a first drive NMOS transistor and a first load PMOS transistor which constitute a first inverter that is selectively activated in response to the operation of the second access NMOS transistor, and a second drive NMOS transistor and a second load PMOS transistor which constitute a second inverter that is selectively activated in response to the operation of the first access NMOS transistor. The SRAM includes an SOI substrate and first and second active areas. The first active area is formed on the SOI substrate and has a first access NMOS transistor and a first inverter which is comprised of a first drive NMOS transistor and a first load PMOS transistor. The second active area is formed on the SOI substrate and has a second access NMOS transistor and a second inverter which is comprised of a second drive NMOS transistor and a second load PMOS transistor. A portion of each of the first and second active areas where the first and second load PMOS transistors are formed, respectively, extends so as to make a predetermined angle with a portion of each of the first and second active areas where the NMOS transistors are formed. The drain (or source) of the first access NMOS transistor, the drain of the first drive NMOS transistor, and the drain of the first load PMOS transistor are formed in a shared region of the first active area so as to be electrically connected to one another. The drain (or source) of the second access NMOS transistor, the drain of the second drive NMOS transistor, and the drain of the second load PMOS transistor are formed in a shared region of the second active area so as to be electrically connected to one another.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

Figure 1:
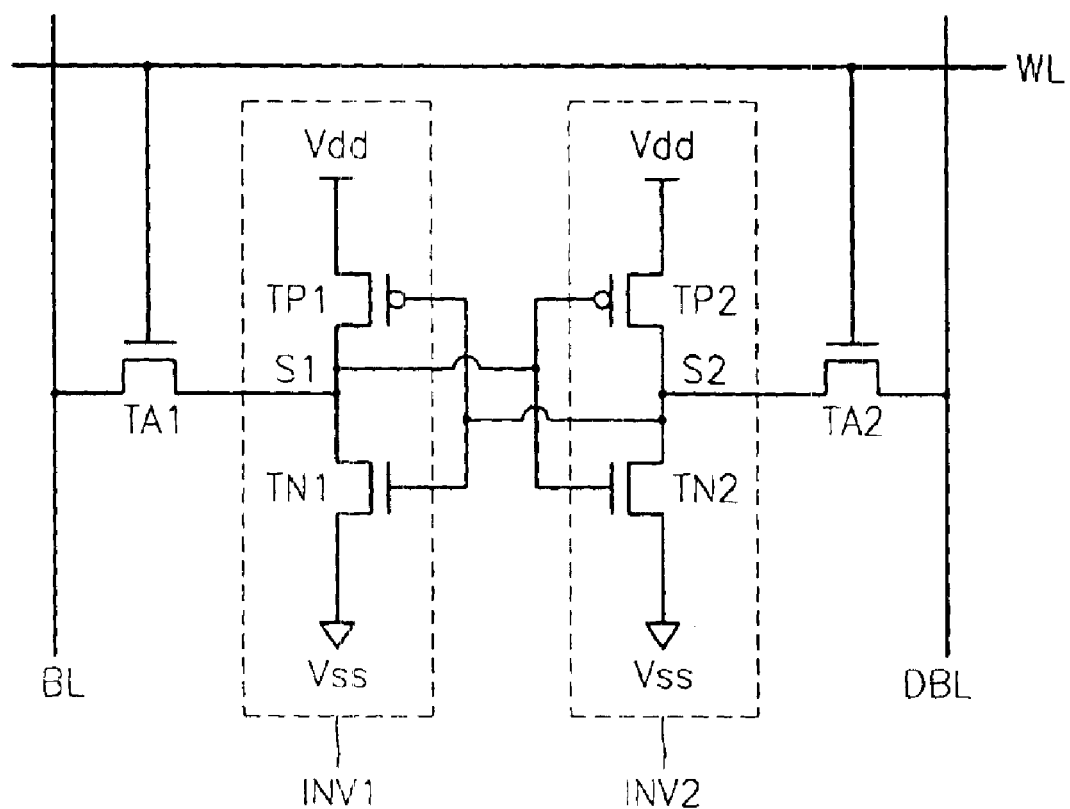
FIG. 1 is a circuit diagram of a conventional full CMOS SRAM.
Figure 2:
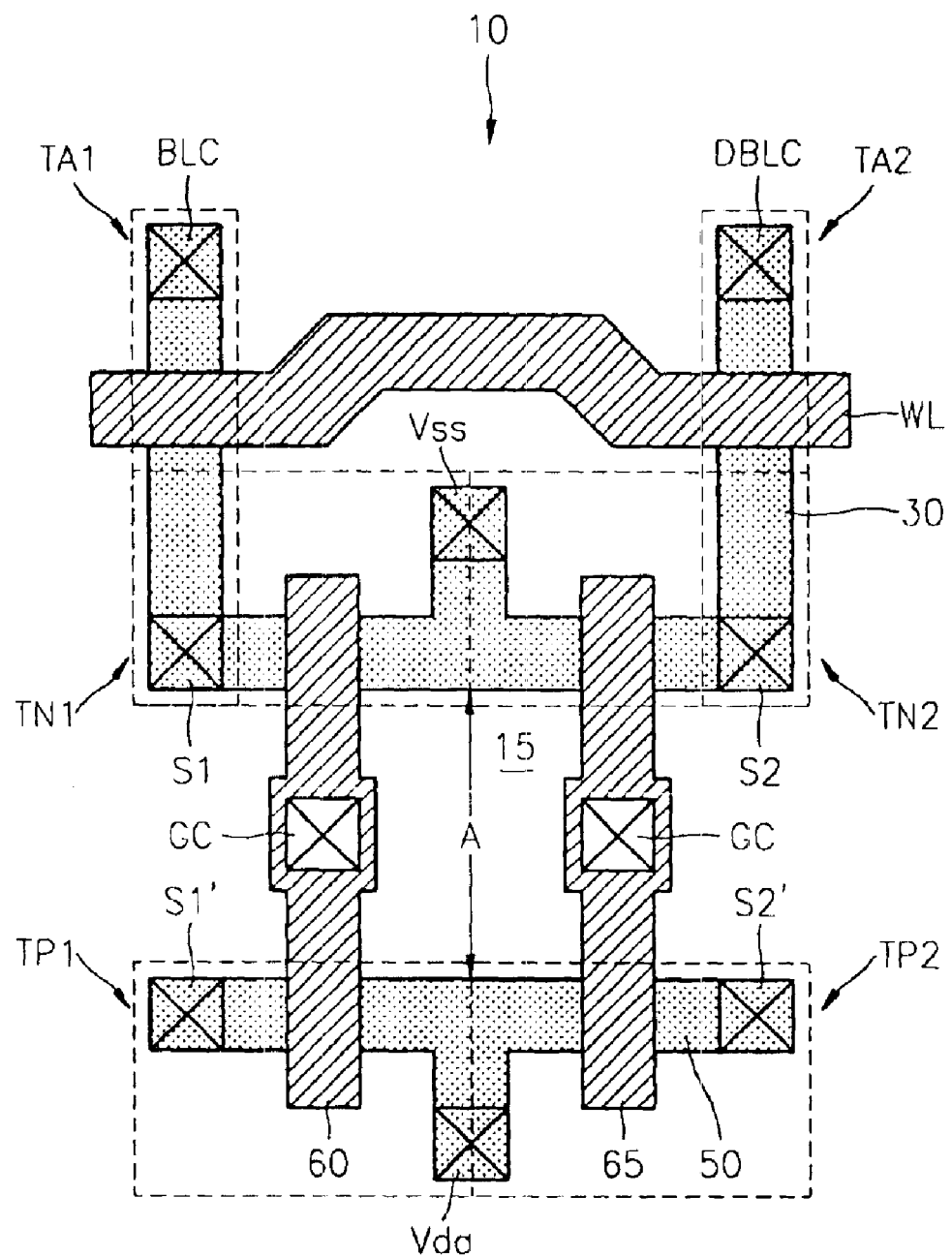
FIG. 2 is a plan view of a conventional full CMOS SRAM integrated into a bulk silicon substrate.

Hereinafter, embodiments of the present invention will be described in detail with reference to the attached drawings. The present invention may, however, be embodied in many different forms and should not be construed as being limited to the embodiments set forth herein; rather, these embodiments are provided so that the present disclosure will be thorough and complete and will fully convey the concept of the invention to those skilled in the art. In the drawings, the shapes of elements are exaggerated for clarity, and like numbers refer to like elements throughout. It will also be understood that when a layer is referred to as being "on" another layer or a substrate, it can be directly on the other layer or substrate, or intervening layers may also be present.

A full CMOS SRAM according to a embodiment of the present invention will now be described with reference to FIGS. 3, 4, 5, and 6. First, an SOI substrate 100 is prepared. As well known, the SOI substrate 100 includes a handling wafer 103, a buried insulating film 105, and a silicon layer 107. The SOI substrate 100 can be formed by attaching two wafers together or by forming a buried insulating film within a silicon substrate by implanting oxygen ions. Through the use of the SOI substrate 100, complete isolation between devices can be achieved, and resistance to stress due to a later-formed isolation film is improved.

Figure 4:
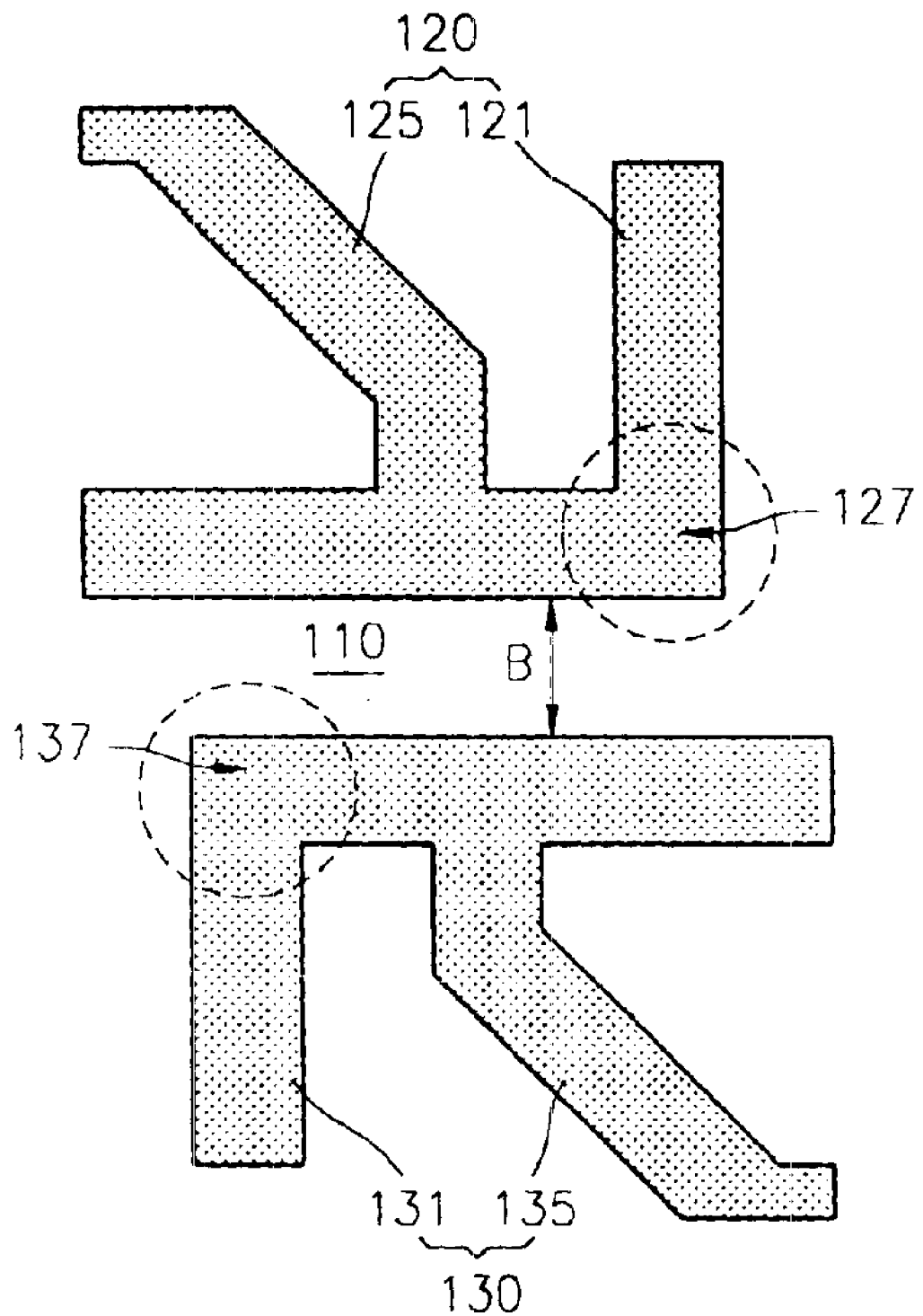
FIG. 4 is a plan view of the active area of the full CMOS SRAM of FIG. 3.

An isolation film 110 is formed on a predetermined portion of a silicon layer 107 of the SOI substrate 100 so that first and second active areas 120 and 130 are defined. The first active area 120 is an area where a first access transistor TA1 and a first PMOS transistor TP1 and a first NMOS transistor TN1 which form a first inverter INV1 are to be formed. The second active area 130 is an area where a second access transistor TA2 and a second PMOS transistor TP2 and a second NMOS transistor TN2 which form a second inverter INV2 are to be formed. The first and second active areas 120 and 130 have the same shape as shown in FIG. 4. However, the second active area 130 is rotated 180° relative to the orientation of the first active area 120. The interval (B) between the first and second active areas 120 and 130 can be set to the shortest distance required to secure the electrical characteristics between semiconductor elements, according to an active isolation design rule. The interval B is sufficiently narrower than the interval A between NMOS and PMOS transistor active areas which is set according to a design rule made to prevent a latch-up between the transistors.

Referring to FIG. 4, the first and second active areas 120 and 130 have oblique protrusions 125 and 135, respectively. The protrusions 125 and 135, where the PMOS transistors TP1 and TP2 are to be formed later, are disposed in an oblique direction, for example, so as to make an angle of about 30° to 60° with a word line to be formed later. Preferably, the angle formed by the protrusions 125 and 135 and the word line to be formed later is 45° so that the protrusions 125 and 135 extend parallel to a [110] silicon crystallization growth direction, because the effective mobility of holes, which are the main carriers of the PMOS transistors TP1 and TP2, increases when the holes move in the [110] silicon crystallization growth direction. In the embodiment, the first and second active areas 120 and 130 include body portions. 121 and 131, respectively, which have an "L" shape (to be more exact, a 180°-rotated "L" shape), and the protrusions 125 and 135, respectively, which extend in an oblique direction from the edges of the body portions 121 and 131, that is, in the [110] silicon crystallization growth direction.

Figure 3:
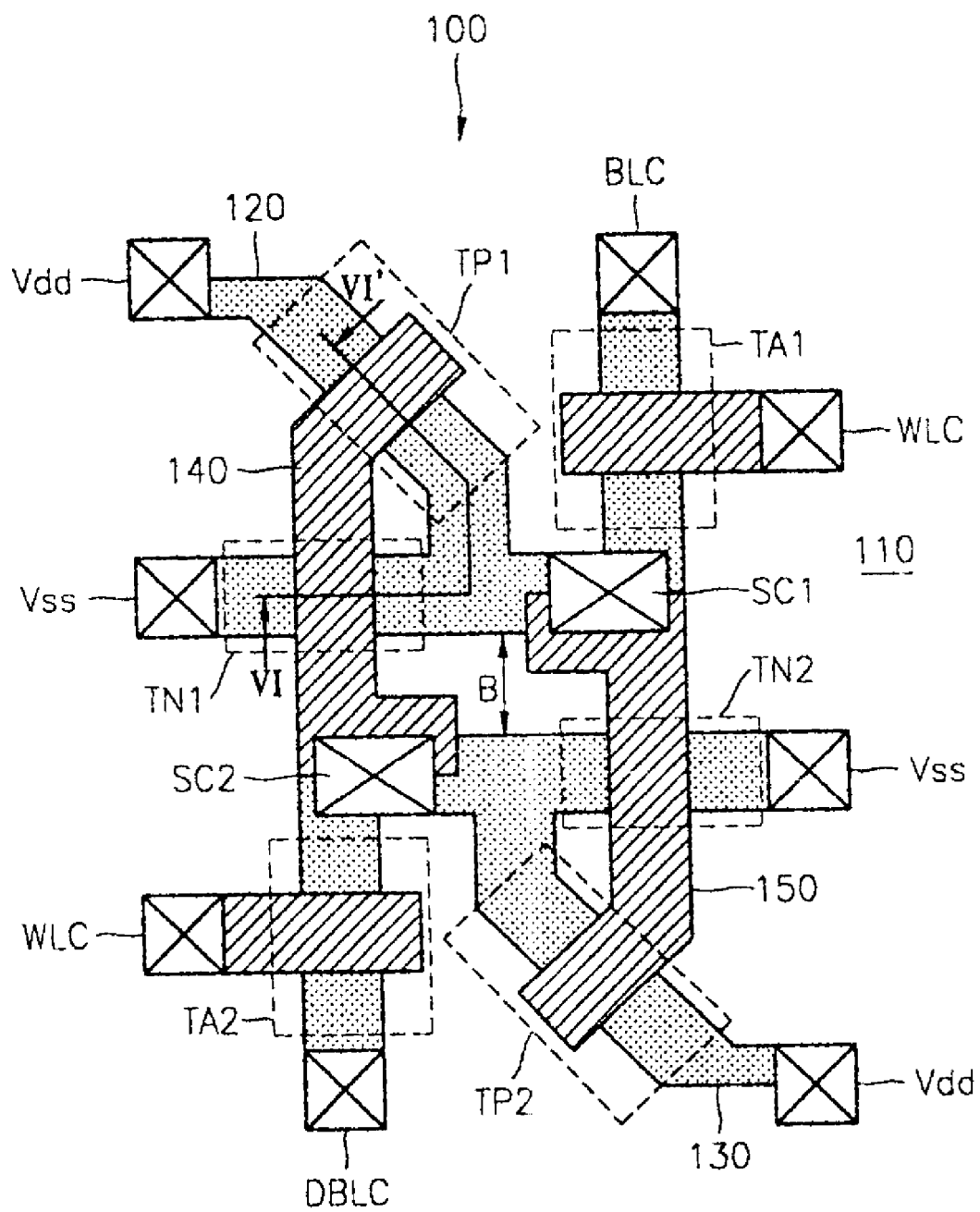
FIG. 3 is a plan view of a full CMOS SRAM according to an embodiment of the present invention which is integrated into an SOI substrate.
Figure 5:
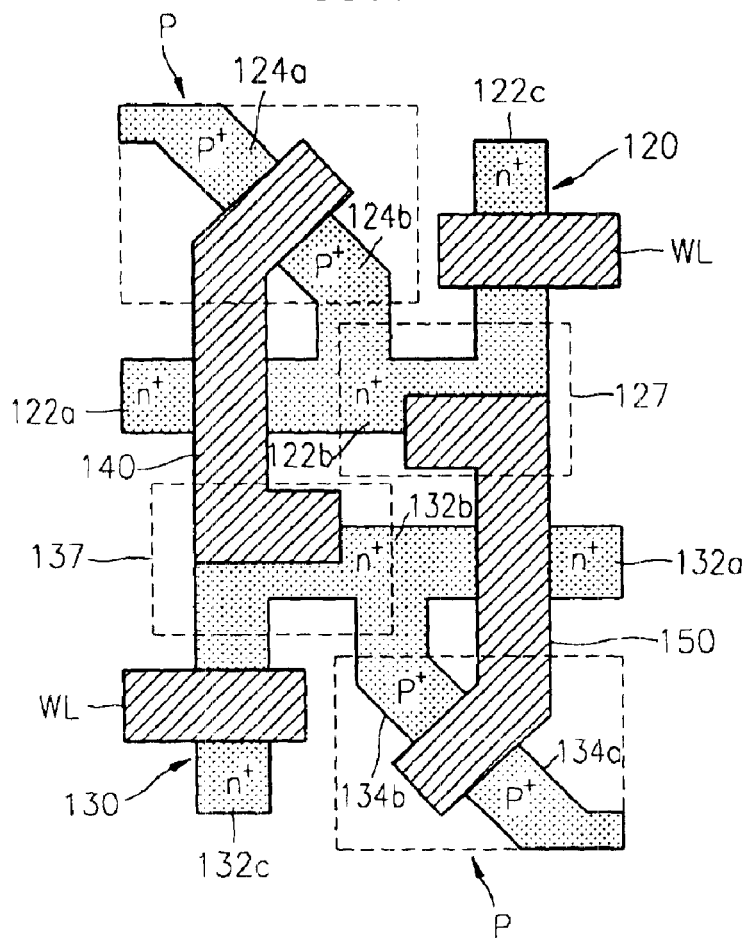
FIG. 5 is a plan view illustrating a gate electrode, a word line, and an active area of the full CMOS SRAM of FIG. 3.

Referring to FIGS. 3 and 5, the first and second gate electrodes 140 and 150 are disposed on the first and second active areas 120 and 130, respectively, and on a predetermined area of the isolation film 110. The word line WL is also disposed on each of the first and second active areas 120 and 130 and the predetermined area of the isolation film 110. Preferably, the first and second gate electrodes 140 and 150 and the word lines WL cross the first and second active areas 120 and 130 at right angles. At this time, since the first and second active areas 120 and 130 have the oblique protrusions 125 and 135, the first and second gate electrodes 140 and 150 can have oblique parts so as to cross the oblique protrusions 125 and 135 at a right angle.

Here, the first gate electrode 140 is shared by the first PMOS transistor TP1 and the first NMOS transistor TN1 and extends so as to overlap a predetermined portion of the second active area 130, for example, an edge 137. Also, the portion of the second active area 130 overlapped by the first gate electrode 140 serves as the output portion of the second inverter INV2. The second gate electrode 150 is shared by the second PMOS transistor TP2 and the second NMOS transistor TN2 and extends so as to overlap a predetermined portion of the first active area 120, for example, an edge 127. Here, the portion of the first active area 120 overlapped by the second gate electrode 150 serves as the output portion of the first inverter INV1. In the embodiment, the word line WL can be rectilinear and disposed so as to cross the vertical portion of each of the L-shaped body portions 121 and 131 at a right angle.

Referring to FIG. 5, impurities are implanted into portions of the first and second active areas 120 and 130 that exist at both sides of each of the first and second gate electrodes 140 and 150 and at both sides of each of the word lines WL, thereby forming junctions 122a, 122b, 122c, 124a, 124b, 132a, 132b, 132c, 134a, and 134b. To be more specific, N-type impurities, for example, phosphorus ions or arsenic ions, can be implanted into the body portions 121 and 131 of the first and second active areas 120 and 130, while P-type impurities, for example, boron, can be implanted into the protrusions 125 and 135 of the first and second active areas 120 and 130. The junction 122a denotes a source region of the first NMOS transistor TN1, the junction 122b denotes a drain region shared by the first NMOS transistor TN1 and the first access transistor TA1, and the junction 122c denotes a source region of the first access transistor TA1. The junction 124a denotes a source region of the first PMOS transistor TP1, and the junction 124b denotes a drain region of the first PMOS transistor TP1 and adjoins the drain region shared by the first NMOS transistor TN1 and the first access transistor TA1. The junction 132a denotes a source region of the second NMOS transistor TN2, the junction 132b denotes a drain region shared by the second NMOS transistor TN2 and the second access transistor TA2, and the junction 132c denotes a source region of the second access transistor TA2. The junction 134a denotes a source region of the second PMOS transistor TP2, the junction 134b denotes a drain region of the second PMOS transistor TP2 and adjoins the drain region shared by the second NMOS transistor TN2 and the second access transistor TA2. A portion indicated by "P" of FIG. 5 denotes a portion into which P-type impurities are to be ion-implanted.

Formed on the edge 127, which is a branch of the protrusion 125 of the first active area 120, is the drain 124b of the first PMOS transistor TP1 and the drain 122b shared by the first NMOS transistor TN1 and the first access transistor TA1. The edge 127 is overlapped by the second gate electrode 150, and provides the output portion of the first inverter INV1. Formed on the edge 137, which is a branch of the protrusion 135 of the second active area 130, is the drain 134b of the second PMOS transistor TP2 and the drain 132b shared by the second NMOS transistor TN2 and the second access transistor TA2. The edge 137 is overlapped by the first gate electrode 140 and provides the output portion of the second inverter INV2. Here, the edges 127 and 137 are referred to as shared regions.

Figure 6:
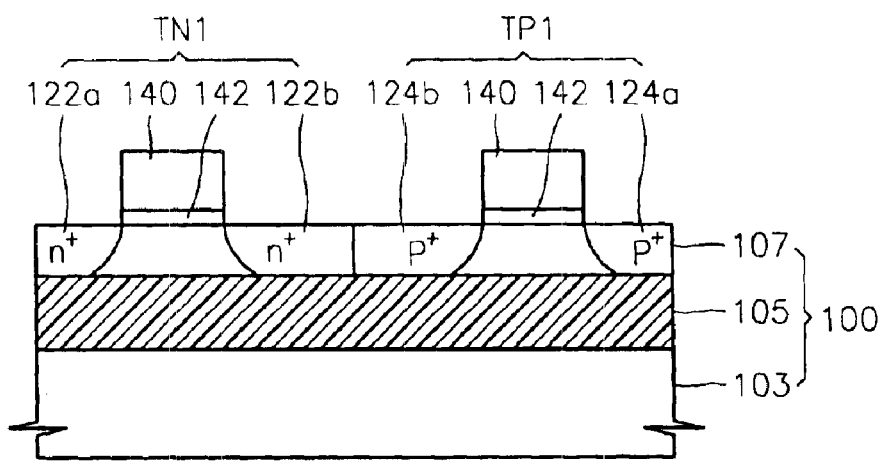
FIG. 6 is a cross-section of the full CMOS SRAM taken along line VI–VI' of FIG. 3.

In the embodiment illustrated above, because an NMOS transistor and a PMOS transistor are formed on each of the active areas 120 and 130 which has no discontinuities, a P-type impurity region and an N-type impurity region are in contact with each other. As shown in FIG. 6, the drain region 122b of the first NMOS transistor TN1 and the drain region 124b of the first PMOS transistor TP1 are formed on the first active area 120 of the silicon layer 107 of the SOI substrate 100 so that the two drain regions contact each other without the need for including an isolation film. If equipotential voltage is applied to the impurity regions, no electrical problems will occur. Here, reference numeral 142 denotes a gate insulative film interposed between the silicon layer 107 and the gate electrode 140. The access transistor TA1, which uses a word line WL as a gate electrode, the first PMOS transistor TP1, and the first NMOS transistor TN1 are completed on the first active area 120, while the access transistor TA2, which uses a word line WL as a gate electrode, the second PMOS transistor TP2, and the second NMOS transistor TN2 are completed on the second active area 130.

Referring back to FIG. 3, reference character BLC denotes a contact region where the source of the first access transistor TA1 contacts a bit line BL, and reference character DBLC denotes a contact region where the source of the second access transistor TA2 contacts a bit line bar DBL. Reference characters SC1 and SC2 denote shared contact regions where all of a gate electrode and the respective drain regions of an access transistor, a PMOS transistor, and an NMOS transistor contact one another. Reference character Vdd denotes a region for contact with a Vdd line (not shown), reference character Vss denotes a region for contact with a Vss line (not shown), and reference character WLC denotes a region for contact with a word line (WL).

Because the SRAM according to the embodiment of the present invention is formed on an SOI substrate, a drive NMOS transistor, for example TN1 or TN2, a load PMOS transistor, for example TP1 or TP2, and an access transistor, for example TA1 or TA2, can be integrated into a single active area, for example 120 or 130. Accordingly, isolation of the PMOS transistor and the NMOS transistor to prevent a latch-up phenomenon is not needed, thus resulting in a reduction of the area of an SRAM unit cell by about 20 to 25% as compared to the area consumed by a conventional SRAM unit cell.

Also, because the SRAM according to the embodiment of the present invention uses the shared contact regions SC1 and SC2, the number of contact regions is reduced. Hence, the SRAM according to the embodiment of the present invention can secure a greater process margin than conventional SRAMs.

Furthermore, in the embodiment illustrated and described above, the channels of the PMOS transistors are disposed in the [110] silicon crystallization growth direction. Thus, the effective mobility of the PMOS transistors and current driving characteristics are improved.

To be more specific, it was reported that since the mobility of holes, which are main carriers, of a PMOS transistor increases in the [110] silicon crystallization growth direction, if the channel of the PMOS transistor is disposed in the [110] silicon crystallization growth direction, the operating speed of the PMOS transistor increases by about 2.5 times greater than when the channel of the PMOS transistor is not disposed in the [110] silicon crystallization growth direction. Accordingly, as in the SRAM according to the embodiment of the present invention, if carriers of a PMOS transistor for use as a load are disposed in the [110] silicon crystallization growth direction, the operating speed of the PMOS transistor increases, while at the same time, reducing the size of the PMOS transistor.

Since a PMOS transistor provides lower mobility than an NMOS transistor, it operates at a slower rate. To solve this problem, at present, a PMOS transistor is formed so as to be approximately 3 times larger than an NMOS transistor, in order to increate its effective operating rate. However, if carriers are disposed in the [110] silicon crystallization growth direction on a PMOS transistor, the current driving capability of the PMOS transistor increases about 2.5 times greater than before, thus reducing the size of the PMOS transistor to approximately the size of an NMOS transistor.

Consequently, the reduction of the area of the PMOS transistor causes a reduction of the area consumed by the SRAM cell according to the embodiment of the present invention.

In summary, a CMOS SRAM according to the present invention is formed on an SOI substrate. Hence, both NMOS and PMOS transistors can be integrated into a single active area, and accordingly, isolation of the NMOS and PMOS transistors is not needed. Also, a well forming process is not required, which simplifies the fabrication process.

Also, because the drain (or source) of an access NMOS transistor, the drain of a drive NMOS transistor, and the drain of a load PMOS transistor contact one another in the same region, the number of contact regions is reduced.

Furthermore, because the channel of a PMOS transistor is disposed so that carriers may move in the [110] silicon crystallization growth direction, the mobility of the PMOS transistor and current driving characteristics are improved. Thus, the area of the PMOS transistor is reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An SRAM comprising:
   first and second access NMOS transistors;
   a first drive NMOS transistor and a first load PMOS transistor which constitute a first inverter which is selectively activated in response to the operation of the second access NMOS transistor; and
   a second drive NMOS transistor and a second load PMOS transistor which constitute a second inverter which is selectively activated in response to the operation of the first access NMOS transistor,
   wherein the transistors are formed on active areas of an SOI substrate, and wherein a portion of an active area where a load PMOS transistor is formed extends so as to make a predetermined acute angle with a portion of an active area where a drive NMOS transistor is formed.

2. The SRAM of claim 1, wherein the predetermined angle is between 30° and 60°.

3. The SRAM of claim 1, wherein the predetermined angle is 45°.

4. The SRAM of claim 1, wherein the portion of the active area where a load PMOS transistor is formed extends in a [110] silicon crystallization growth direction.

5. The SRAM of claim 1, wherein the active area comprises:

a first active area where the first access NMOS transistor and the first inverter are formed; and a second active area where the second access NMOS transistor and the second inverter are formed.

6. The SRAM of claim 5, wherein the drain region of the first drive NMOS transistor and the drain region of the first load PMOS transistor contact each other on the first active area of a silicon layer of the SOI substrate, and wherein the drain region of the second drive NMOS transistor and the drain region of the second load PMOS transistor contact each other on the second active area of the silicon layer of the SOI substrate.

7. The SRAM of claim 6, wherein one of the drain and source of the first access NMOS transistor, the drain of the first drive NMOS transistor, and the drain of the first load PMOS transistor are formed in a shared region of the first active area so as to be electrically connected to one another, and wherein one of the dram and source of the second access NMOS transistor, the drain of the second drive NMOS transistor, and the drain of the second load PMOS transistor are formed in a shared region of the second active area so as to be electrically connected to one another.

8. The SRAM of claim 1, wherein one of the drain and source of the first access NMOS transistor, the drain of the first drive NMOS transistor, and the drain of the first load PMOS transistor are formed in a shared region of the first active area so as to be electrically connected to one another, and wherein one of the drain and source of the second access NMOS transistor, the drain of the second drive NMOS transistor, and the drain of the second load PMOS transistor are formed in a shared region of the second active area so as to be electrically connected to one another.

9. An SRAM comprising:

a semiconductor substrate;

a first active area formed on the semiconductor substrate and having a first access NMOS transistor and a first inverter which is comprised of a first drive NMOS transistor and a first load PMOS transistor; and a second active area formed on the semiconductor substrate and having a second access NMOS transistor and a second inverter which is comprised of a second drive NMOS transistor and a second load PMOS transistor, wherein a portion of each of the first and second active areas where the first and second load PMOS transistors are formed, respectively, extends so as to make a predetermined acute angle with a portion of each of the first and second active areas where the NMOS transistors are formed.

10. The SRAM of claim 9, wherein the predetermined angle is between 30° and 60°.

11. The SRAM of claim 9, wherein the predetermined angle is 45°.

12. The SRAM of claim 9, wherein the portion of the active area where a load PMOS transistor is formed extends in the [110] silicon crystallization growth direction.

13. The SRAM of claim 9, wherein the drain region of the first drive NMOS transistor and the drain region of the first load PMOS transistor contact each other on the first active area of the semiconductor substrate, and wherein the drain region of the second drive NMOS transistor and the drain region of the second load PMOS transistor contact each other on the second active area of the semiconductor substrate.

14. The SRAM of claim 13, wherein one of the drain and source of the first access NMOS transistor, the drain of the first drive NMOS transistor, and the drain of the first load PMOS transistor are formed in a shared region of the first active area so as to be electrically connected to one another, and wherein one of the drain and source of the second access NMOS transistor, the drain of the second drive NMOS transistor, and the drain of the second load PMOS transistor are formed in a shared region of the second active area so as to be electrically connected to one another.

15. The SRAM of claim 9, wherein one of the drain and source of the first access NMOS transistor, the drain of the first drive NMOS transistor, and the drain of the first load PMOS transistor are formed in a shared region of the first active area so as to be electrically connected to one another, and wherein one of the drain and source of the second access NMOS transistor, the drain of the second drive NMOS transistor, and the drain of the second load PMOS transistor are formed in a shared region of the second active area so as to be electrically connected to one another.

16. The SRAM of claim 14, wherein the semiconductor substrate is an SOI substrate.

17. An SRAM formed with first and second access NMOS transistors, a first drive NMOS transistor and a first load PMOS transistor which constitute a first inverter that is selectively activated in response to the operation of the second access NMOS transistor, and a second drive NMOS transistor and a second load PMOS transistor which constitute a second inverter that is selectively activated in response to the operation of the first access NMOS transistor, the SRAM comprising:

an SOI substrate;

a first active area formed on the SOI substrate and having a first access NMOS transistor and a first inverter which is comprised of a first drive NMOS transistor and a first load PMOS transistor; and a second active area formed on the SOI substrate and having a second access NMOS transistor and a second inverter which is comprised of a second drive NMOS transistor and a second load PMOS transistor, wherein a portion of each of the first and second active areas where the first and second load PMOS transistors are formed, respectively, extends so as to make a predetermined acute formed.

18. The SRAM of claim 17, wherein the predetermined angle is between 30° and 60°.

19. The SRAM of claim 17, wherein the predetermined angle is 45°.

20. The SRAM of claim 17, wherein the portion of the active area where a load PMOS transistor is formed extends in the [110] silicon crystallization growth direction.

21. An SRAM formed with first and second access NMOS transistors, a first drive NMOS transistor and a first load PMOS transistor which constitute a first inverter that is selectively activated in response to the operation of the second access NMOS transistor, and a second drive NMOS transistor and a second load PMOS transistor which constitute a second inverter that is selectively activated in response to the operation of the first access NMOS transistor, the SRAM comprising:

an SOI substrate;

a first active area formed on the SOI substrate and having a first access NMOS transistor and a first inverter which is comprised of a first drive NMOS transistor and a first load PMOS transistor; and a second active area formed on the SOI substrate and having a second access NMOS transistor and a second inverter which is comprised of a second drive NMOS transistor and a second load PMOS transistor, wherein a portion of each of the first and second active areas where the first and second load PMOS transistors are formed, respectively, extends so as to make a predetermined acute angle with a portion of each of the first and second active areas where the NMOS transistors are formed, wherein one of the drain and source of the first access NMOS transistor, the drain of the first drive NMOS transistor, and the drain of the first load PMOS transistor are formed in a shared region of the first active area so as to be electrically connected to one another, and wherein one of the drain and source of the second access NMOS transistor, the drain of the second drive NMOS transistor, and the drain of the second load PMOS transistor are formed in a shared region of the second active area so as to be electrically connected to one another.

22. The SRAM of claim 21, wherein the predetermined angle is between 30° and 60°.

23. An SRAM formed with first and second access NMOS transistors, a first drive NMOS transistor and a first load PMOS transistor which constitute a first inverter that is selectively activated in response to the operation of the second access NMOS transistor, and a second drive NMOS transistor and a second load PMOS transistor which constitute a second inverter that is selectively activated in response to the operation of the first access NMOS transistor, the SRAM comprising:

an SOI substrate;

a first active area formed on the SOI substrate and having a first access NMOS transistor and a first inverter which is comprised of a first drive NMOS transistor and a first load PMOS transistor; and a second active area formed on the SOI substrate and having a second access NMOS transistor and a second inverter which is comprised of a second drive NMOS transistor and a second load PMOS transistor, wherein a portion of each of the first and second active areas where the first and second load PMOS transistors are formed extends so as to make an angle of approximately 45 degrees with a portion of each of the first and second active areas where the NMOS transistors are formed, wherein one of the drain and source of the first access NMOS transistor, the drain of the first drive NMOS transistor, and the drain of the first load PMOS transistor are formed in a shared region of the first active area so as to be electrically connected to one another, and wherein one of the drain and source of the second access NMOS transistor, the drain of the second drive NMOS transistor, and the drain of the second load PMOS transistor are formed in a shared region of the second active area so as to be electrically connected to one another.

24. An SRAM comprising:

first and second access NMOS transistors;

a first drive NMOS transistor and a first load PMOS transistor which constitute a first inverter which is selectively activated in response to the operation of the second access NMOS transistor; and a second drive NMOS transistor and a second load PMOS transistor which constitute a second inverter which is selectively activated in response to the operation of the first access NMOS transistor, wherein the transistors are formed on active areas of an SOI substrate, and wherein a portion of an active area where a load PMOS transistor is formed extends so as to make a predetermined angle with a portion of an active area where a drive NMOS transistor is formed;

wherein the portion of the active area where a load PMOS transistor is formed extends in a silicon crystallization growth direction.

25. An SRAM comprising:

a semiconductor substrate;

a first active area formed on the semiconductor substrate and having a first access NMOS transistor and a first inverter which is comprised of a first drive NMOS transistor and a first load PMOS transistor; and a second active area formed on the semiconductor substrate and having a second access NMOS transistor and a second inverter which is comprised of a second drive NMOS transistor and a second load PMOS transistor, wherein a portion of each of the first and second active areas where the first and second load PMOS transistors are formed, respectively, extends so as to make a predetermined angle with a portion of each of the first and second active areas where the NMOS transistors are formed;

wherein the portion of the active area where a load PMOS transistor is formed extends in the [110] silicon crystallization growth direction.

* * * * *

UNITED STATES PATENT AND TRADEMARK OFFICE
CERTIFICATE OF CORRECTION

PATENT NO.    : 6,900,503 B2
DATED         : May 31, 2005
INVENTOR(S)   : Chang-bong Oh et al.

It is certified that error appears in the above-identified patent and that said Letters Patent is hereby corrected as shown below:

Column 9,
Line 18, delete "dram" and insert -- drain --.

Column 10,
Line 41, after "acute" insert -- angle with a portion of each of the first and second active areas where the NMOS transistors are --.

Signed and Sealed this

Thirtieth Day of August, 2005

JON W. DUDAS
*Director of the United States Patent and Trademark Office*